United States Patent
Liu

(10) Patent No.: US 10,418,382 B2
(45) Date of Patent: Sep. 17, 2019

(54) THIN FILM TRANSISTOR ARRAY SUBSTRATE, SUBSTRATE AND MANUFACTURING METHOD THEREOF

(71) Applicant: Wuhan China Star Optoelectronics Technology Co., Ltd., Wuhan, Hubei (CN)

(72) Inventor: Zhe Liu, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 192 days.

(21) Appl. No.: 15/521,175

(22) PCT Filed: Mar. 10, 2017

(86) PCT No.: PCT/CN2017/076315
§ 371 (c)(1),
(2) Date: Apr. 21, 2017

(87) PCT Pub. No.: WO2018/149001
PCT Pub. Date: Aug. 23, 2018

(65) Prior Publication Data
US 2018/0301471 A1    Oct. 18, 2018

(30) Foreign Application Priority Data
Feb. 20, 2017    (CN) .......................... 2017 1 0090819

(51) Int. Cl.
*H01L 27/14* (2006.01)
*H01L 27/12* (2006.01)
*H01L 21/77* (2017.01)

(52) U.S. Cl.
CPC .......... *H01L 27/1218* (2013.01); *H01L 21/77* (2013.01); *H01L 27/1262* (2013.01)

(58) Field of Classification Search
CPC .. H01L 27/12; H01L 27/1218; H01L 27/1262
See application file for complete search history.

(56) References Cited

U.S. PATENT DOCUMENTS

| | | | |
|---|---|---|---|
| 2010/0051973 A1* | 3/2010 | Kobayashi | H01L 51/56 257/88 |
| 2012/0102734 A1 | 5/2012 | Choi | |
| 2014/0160414 A1* | 6/2014 | Kubota | G02F 1/134363 349/138 |
| 2014/0319493 A1* | 10/2014 | Lee | H01L 29/78603 257/40 |
| 2018/0104915 A1 | 4/2018 | Liu | |

FOREIGN PATENT DOCUMENTS

| CN | 1591840 A | 3/2005 |
|---|---|---|
| CN | 105702624 A | 6/2016 |

* cited by examiner

*Primary Examiner* — Phuc T Dang
(74) *Attorney, Agent, or Firm* — Mark M. Friedman

(57) ABSTRACT

A substrate, a thin film transistor array substrate, and a manufacturing method are provided. The substrate includes a main plate, a first film layer, a second film layer, and an insulation layer. The first film layer is disposed on the main plate, and is provided with at least two recesses. The insulation layer is disposed on the first film layer. The second film layer is disposed on the insulation layer and provided with at least two protrusions facing the insulation layer. The amount of stress accumulated is effectively reduced after the substrate is heated.

18 Claims, 6 Drawing Sheets

THIN FILM TRANSISTOR ARRAY SUBSTRATE, SUBSTRATE AND MANUFACTURING METHOD THEREOF

FIELD OF THE INVENTION

The present disclosure relates to the technical field of displays, and particularly to a thin film transistor array substrate, a substrate, and a manufacturing method thereof.

BACKGROUND OF THE INVENTION

Conventional thin film transistor array substrates typically include a substrate and a display device. The display device is disposed on the substrate.

The substrate is typically a single layer of glass or plastic sheet.

In practice, the inventors have found that the prior art has at least the following problem:

During the manufacturing process of the display device, the substrate is heated and undergoes great deformation due to the accumulation of stress.

Therefore, it is necessary to propose a new technical solution to solve the above technical problem.

SUMMARY OF THE INVENTION

An object of the present disclosure is to provide a thin film transistor array substrate, a substrate, and a manufacturing method thereof, which can effectively reduce the amount of the accumulated stress after the substrate is heated, thereby preventing the substrate from undergoing great deformation.

In order to solve the above-mentioned problems, the technical solution of the present disclosure is as follows:

A substrate comprising: a main plate; a first film layer disposed on the main plate, wherein a recess array is defined in a side of the first film layer opposite the substrate, and the recess array includes at least two recesses; an insulation layer disposed on the side of the first film layer in which the recesses are defined; and a second film layer provided with a protrusion array, wherein the protrusion array includes at least two protrusions facing the insulation layer, and the second film layer is disposed on the insulation layer; wherein a shape of the protrusions corresponds to a shape of the recesses, and a position of the protrusions on the second film layer corresponds to a position of the recesses in the first film layer.

In the above substrate, the first film layer having the recesses is formed by coating a first polyamic acid solution on the main plate, pre-curing the first polyamic acid solution to form a first liquid film, embossing the first liquid film to form the recesses in the first liquid film by using a first embossing plate, and curing the first liquid film formed with the recesses; wherein a concentration of the first liquid film is within a first predetermined range.

In the above substrate, the second film layer having the protrusions is formed by coating a second polyamic acid solution on the insulation layer, pre-curing the second polyamic acid solution to form a second liquid film, embossing the second liquid film to form the protrusions on the second liquid film by using a second embossing plate, and curing the second liquid film formed with the protrusions; wherein a concentration of the second liquid film is within a second predetermined range.

In the above substrate, the recesses and the protrusions are configured to collectively prevent an amount of stress from accumulating on the substrate, and to collectively reduce an amount of deformation of the substrate during a high temperature process.

In the above substrate, the recesses and the protrusions are configured to collectively enhance an adhesion of the first film layer, the second film layer, and the insulation layer.

In the above substrate, a length and/or a width of a cross section of each of the recesses is within a range from 10 nanometers to 1000 nanometers; and a length and/or a width of a cross-section of each of the protrusions is in a range from 10 nanometers to 1000 nanometers.

In the above substrate, a ratio of a thickness difference of any two portions of the insulation layer to an average thickness of the insulation layer is within a range from 0% to 20%.

A thin film transistor array substrate, comprising: a substrate including: a main plate; a first film layer disposed on the main plate, wherein a recess array is defined in a side of the first film layer opposite the main plate, and the recess array includes at least two recesses; an insulation layer disposed on the side of the first film layer in which the recesses are defined; and a second film layer provided with a protrusion array, wherein the protrusion array includes at least two protrusions facing the insulation layer, and the second film layer is disposed on the insulation layer; wherein a shape of the protrusions corresponds to a shape of the recesses, and a position of the protrusions on the second film layer corresponds to a position of the recesses in the first film layer; and a display device disposed on the second film layer of the substrate.

In the above thin film transistor array substrate, the first film layer having the recesses is formed by coating a first polyamic acid solution on the main plate, pre-curing the first polyamic acid solution to form a first liquid film, embossing the first liquid film to form the recesses on the first liquid film by using a first embossing plate, and curing the first liquid film formed with the recesses; wherein a concentration of the first liquid film is within a first predetermined range.

In the above thin film transistor array substrate, the second film layer having the protrusions is formed by coating a second polyamic acid solution on the insulation layer, pre-curing the second polyamic acid solution to form a second liquid film, embossing the second liquid film to form the protrusions on the second liquid film by using a second embossing plate, and curing the second liquid film formed with the protrusions; wherein a concentration of the second liquid film is within a second predetermined range.

In the above thin film transistor array substrate, the recesses and the protrusions are configured to collectively prevent an amount of stress from accumulating on the substrate, and to collectively reduce an amount of deformation of the substrate during a high temperature process.

In the above thin film transistor array substrate, the recesses and the protrusions are configured to collectively enhance an adhesion of the first film layer, the second film layer, and the insulation layer.

In the above thin film transistor array substrate, a length and/or a width of a cross section of each of the recesses is within a range from 10 nanometers to 1000 nanometers; and a length and/or a width of a cross-section of each of the protrusions are/is in a range from 10 nanometers to 1000 nanometers.

In the above thin film transistor array substrate, a ratio of a thickness difference of any two portions of the insulation layer to an average thickness of the insulation layer is within a range from 0% to 20%.

A method of manufacturing the substrate, comprising steps of: A. disposing the first film layer on the main plate, wherein the recess array is defined in the side of the first film layer opposite the main plate, and the recess array includes at least two of the recesses; B. disposing the insulation layer on the side of the first film layer in which the recesses are defined; and C. disposing the second film layer on the insulation layer, wherein the second film layer provided with the protrusion array, the protrusion array includes at least two protrusions facing the insulation layer, the shape of the protrusions corresponds to the shape of the recesses, and the position of the protrusions on the second film layer corresponds to the position of the recesses in the first film layer.

In the method for manufacturing the substrate, the step A includes: a1. coating a first polyamic acid solution on the main plate; a2. pre-curing the first polyamic acid solution to form a first liquid film, wherein a concentration of the first liquid film is within a first predetermined range; a3. embossing the first liquid film to form the recesses in the first liquid film by using a first embossing plate; and a4. curing the first liquid film formed with the recesses to form the first film layer having the recesses.

In the method for manufacturing the substrate, the step B is depositing a predetermined material on the side of the first film layer in which the recesses are defined to form the insulation layer; wherein the predetermined material includes at least one of amorphous silicon, polysilicon, silicon oxide, aluminum oxide, and titanium oxide.

In the method for manufacturing the substrate, the step C includes: c1. coating a second polyamic acid solution on the insulation layer; c2. pre-curing the second polyamic acid solution to form a second liquid film, wherein a concentration of the second liquid film is within a second predetermined range; c3. embossing the second liquid film to form the protrusions on the second liquid film by using a second embossing plate; and c4. curing the second liquid film formed with the protrusions to form the second film layer having the protrusions.

In the method for manufacturing the substrate, the recesses and the protrusions are configured to collectively prevent an amount of stress from accumulating on the substrate, and to collectively reduce an amount of deformation of the substrate during a high temperature process.

In the method for manufacturing the substrate, a length and/or a width of a cross section of each of the recesses is within a range from 10 nanometers to 1000 nanometers; and a length and/or a width of a cross-section of each of the protrusions is in a range from 10 nanometers to 1000 nanometers.

Compared with the conventional technique, in the present disclosure, the substrate includes a main plate, a first film layer, an insulation layer, and a second film layer. The first film layer is disposed on the main plate body. The insulation layer is disposed between the first film layer and the second film layer. The first film layer is provided with recesses, the second film layer is provided with protrusions, and the recesses and the protrusions face each other and are coupled with each other. Hence, the substrate can effectively reduce the amount of the accumulated stress after heated, and thereby the substrate is prevented from undergoing a great deformation.

In order to make the above content of the present disclosure more easily understood, a detailed description is provided as follows by taking the preferred embodiments in conjunction with the accompanying drawings in the following context.

DETAILED DESCRIPTION OF THE PREFERRED EMBODIMENTS

The term "embodiment" used in this specification refers to an example, instance, or illustration. In addition, the articles "a" or "an" used in this specification and the appended claims may generally be construed as one or more unless otherwise is distinctly specified based upon the context.

Figure 1:
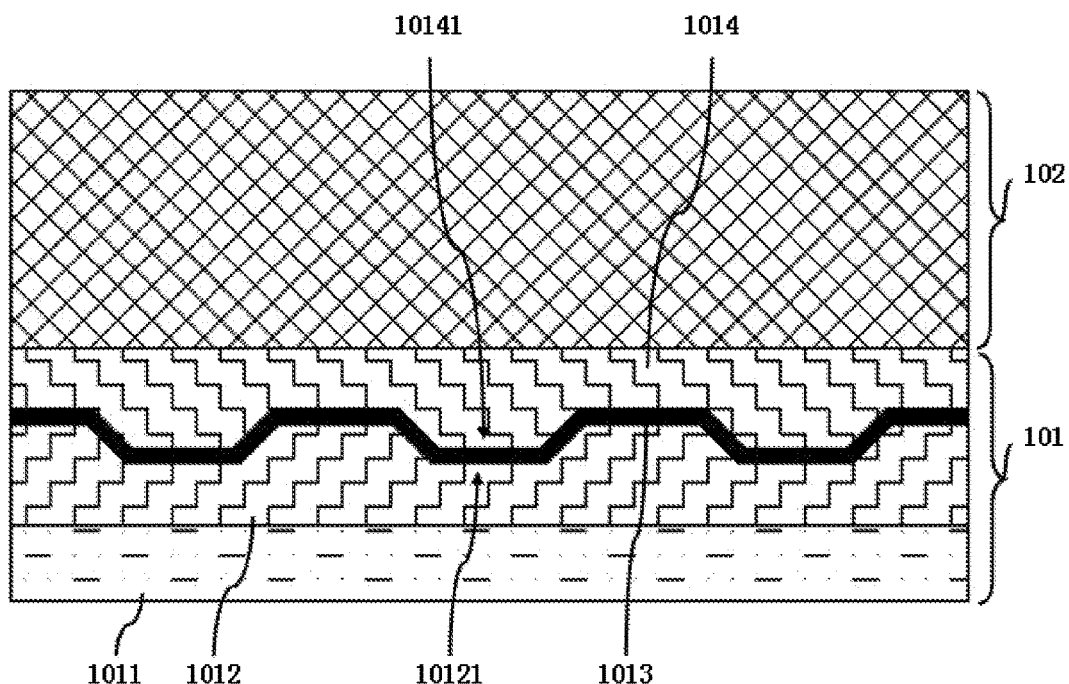
FIG. 1 is a schematic view of a thin film transistor array substrate of the present disclosure.
Figure 2:
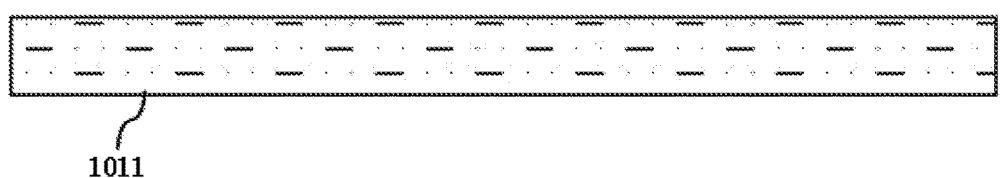
FIG. 2-FIG. 6 are schematic views of a method for manufacturing a substrate in accordance with the present disclosure.
Figure 3:
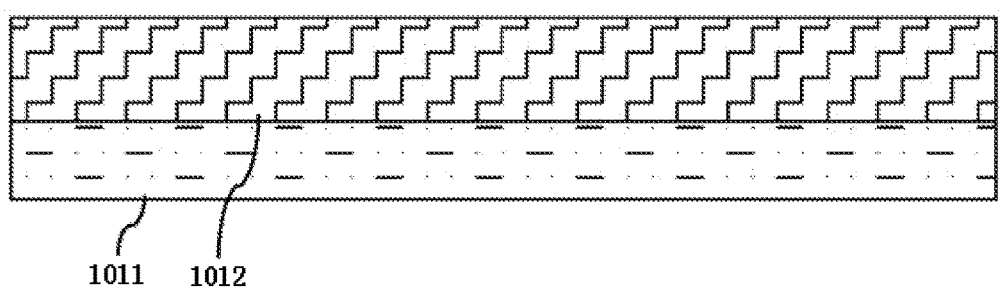
Figure 4:
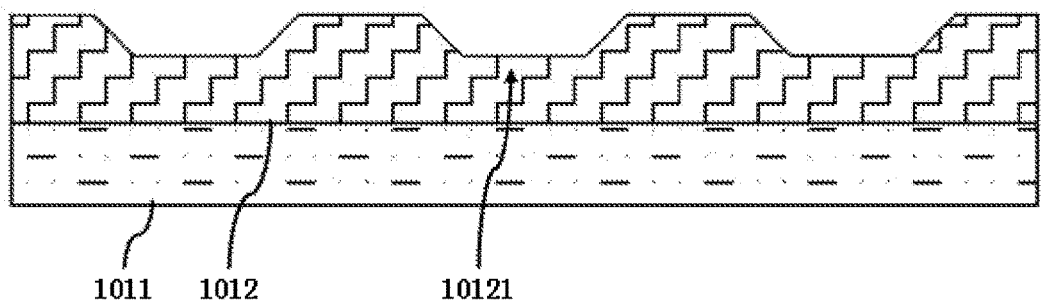
Figure 5:
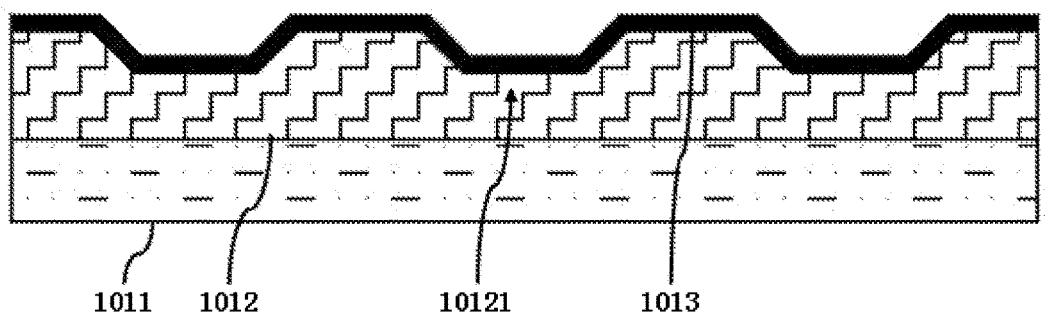
Figure 6:
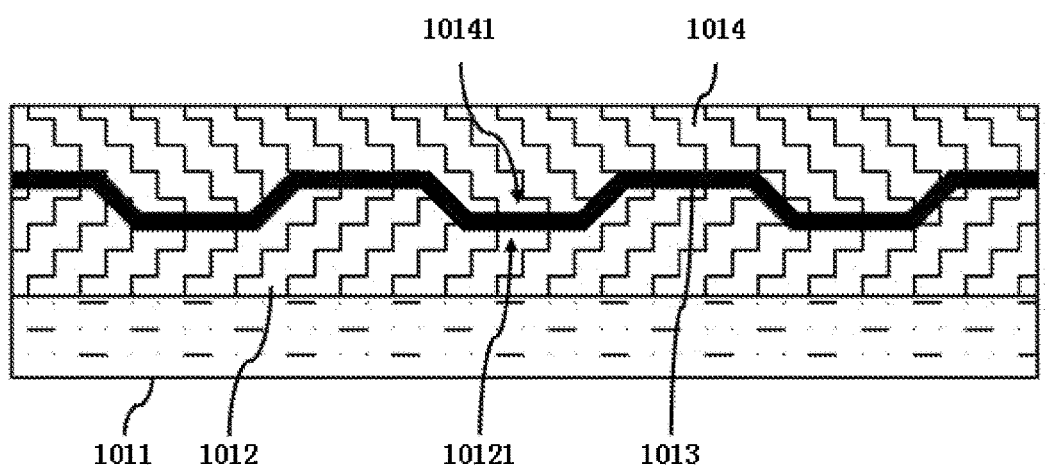

FIG. 1 is a schematic view of a thin film transistor array substrate of the present disclosure.

The thin film transistor array substrate of the present disclosure includes a substrate 101 and a display device 102. The thin film transistor array substrate can be applied to a thin film transistor liquid crystal display panel (TFT-LCD), an organic light emitting diode display panel (OLED), and the like.

The display device 102 includes a scan line, a data line, a thin film transistor switch, a pixel unit, and the like.

The substrate 101 includes a main plate 1011, a first film layer 1012, an insulation layer 1013, and a second film layer 1014.

The material of the main board body 1011 may be glass or plastic.

The first film layer 1012 is disposed on the main plate 1011. A recess array is defined in a side of the first film layer 1012 opposite the main plate. The recess array includes at least two recesses 10121.

The insulation layer 1013 is disposed on the side of the first film layer 1012 in which the recesses 10121 are defined.

The second film layer 1014 is provided with a protrusion array. The protrusion array includes at least two protrusions 10141 facing the insulation layer 1013. The second film layer 1014 is disposed on the insulation layer 1013.

The shape of the protrusions 10141 corresponds to the shape of the recesses 10121, and the position of the protrusions 10141 on the second film layer 1014 corresponds to the position of the recesses 10121 in the first film layer 1012.

The display device 102 is disposed on the second film layer 1014 of the substrate 101.

In the substrate 101 of the present disclosure, the first film layer 1012 having the recesses 10121 is formed by coating a first polyamic acid solution on the main plate, pre-curing the first polyamic acid solution to form a first liquid film, embossing the first liquid film to form the recesses 10121 in the first liquid film by using a first embossing plate, and curing the first liquid film formed with the recesses 10121.

The concentration of the first liquid film is within a first predetermined range.

In the substrate 101 of the present disclosure, the second film layer 1014 having the protrusions 10141 is formed by coating a second polyamic acid solution on the insulation layer, pre-curing the second polyamic acid solution to form a second liquid film, embossing the second liquid film to form the protrusions 10141 on the second liquid film by using a second embossing plate, and curing the second liquid film formed with the protrusions 10141.

The concentration of the second liquid film is within a second predetermined range.

Figure 14:
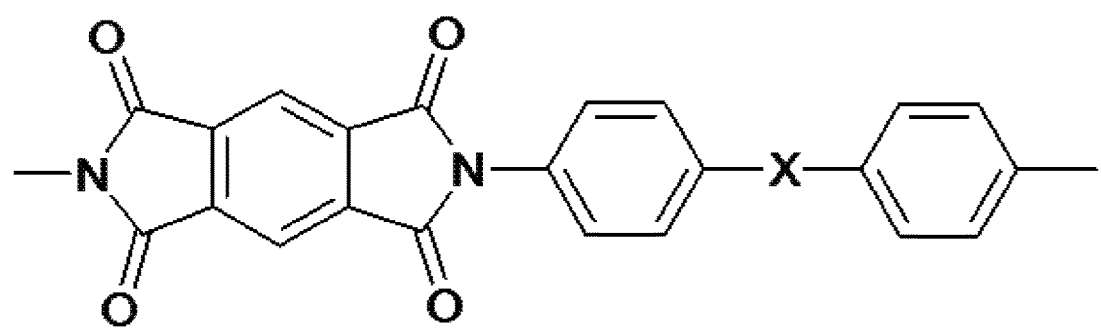
FIGS. 14 and 15 are molecular views of materials of the first film layer and/or the second film layer in the substrate of the present disclosure.
Figure 15:
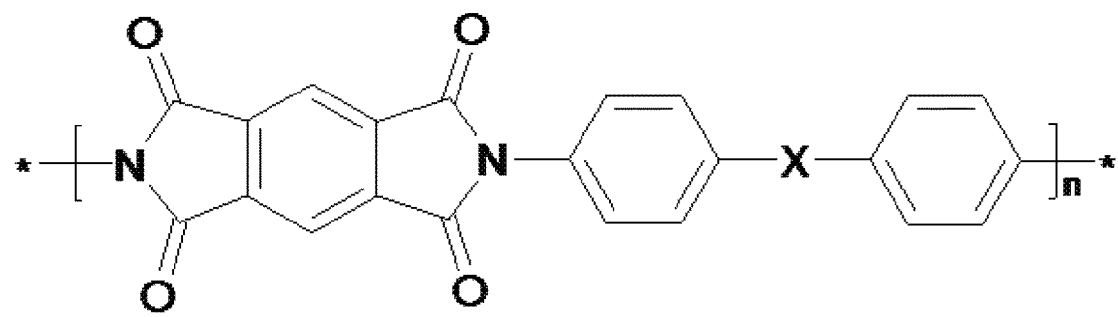

The material of the first film layer 1012 and/or the second film layer 1014 is made of polyimide (PI). The molecular structure of the material of the first film layer 1012 and/or the second film layer 1014 is as shown in FIG. 14 and FIG. 15.

The recesses 10121 and the protrusions 10141 are configured to collectively prevent an amount of stress from accumulating on the substrate 101, and to collectively reduce an amount of deformation of the substrate 101 during a high temperature process.

The recesses 10121 and the protrusions 10141 are configured to collectively enhance the adhesion the first film layer (polyimide layer) 1012, the second film layer (polyimide layer) 1014 and the insulation layer 1013 for preventing the substrate 101 from being partially peeled off during the bending process.

The first embossing plate and/or the second embossing plate is a rigid embossing plate having a first rigidity. The rigid embossing plate is made of a combination of one or more than one of silicon, silicon oxide, and quartz.

The first embossing plate is provided with first embossing portions corresponding to the recesses 10121. The first embossing portions are formed by a laser writing technique on the plate body of the first plate. The second embossing plate is provided with second embossing portions corresponding to the protrusions 10141. The second embossing portions are formed by a laser writing technique on the plate body of the second embossing plate.

Alternatively, the first embossing plate and/or the second embossing plate are/is a soft embossing plate having a second rigidity. The second rigidity is less than the first rigidity. The soft embossing plate is made by coating polydimethylsiloxane (PDMS) on the rigid embossing plate, heating the polydimethylsiloxane or irradiating the polydimethylsiloxane with ultraviolet light for curing the polydimethylsiloxane, and separating the cured polydimethylsiloxane from the rigid embossing plate.

In the substrate 101 of the present disclosure, the insulation layer 1013 is formed by depositing a predetermined material on the side of the first film layer 1012 on which the recesses 10121 are disposed, wherein the predetermined material includes at least one of amorphous silicon, polysilicon, silicon oxide, aluminum oxide, and titanium oxide.

In the substrate 101 of the present disclosure, the length and/or the width of the cross section of each of the recesses 10121 is in the range of 10 nm to 1000 nm. For example, the cross section of the recesses 10121 has a length and/or a width of 10 nm, 50 nm, 100 nm, 150 nm, 200 nm, 250 nm, 300 nm, 350 nm, 400 nm, 450 nm, 550 nm, 600 nm, 650 nm, 700 nm, 750 nm, 800 nm, 850 nm, 900 nm, 950 nm, or 1000 nm.

The length and/or the width of the cross section of each of the protrusion 10141 is within the range of 10 nanometers to 1000 nanometers. For example, the length and/or the width of the cross section of the protrusion 10141 is 10 nm, 50 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, or 1000 nm.

The shape of the recesses 10121 and/or the protrusions 10141 is a combination of one or more of a dot, a line, a two-dimensional pattern, and a three-dimensional pattern.

As an improvement, a ratio of a thickness difference of any two portions of the insulation layer 1013 to an average thickness of the insulation layer is within a range from 0% to 20%. For example, the ratios can be 0%, 3%, 6%, 9%, 12%, 15%, 18%, or 20%.

Figure 7:
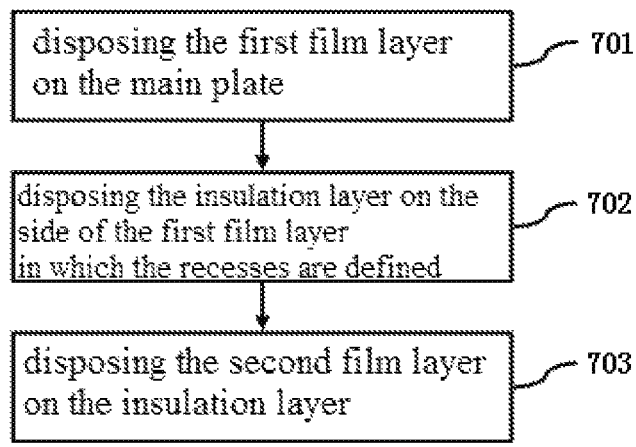
FIG. 7 is a flow chart of a method for manufacturing a substrate in accordance with the present disclosure.
Figure 8:
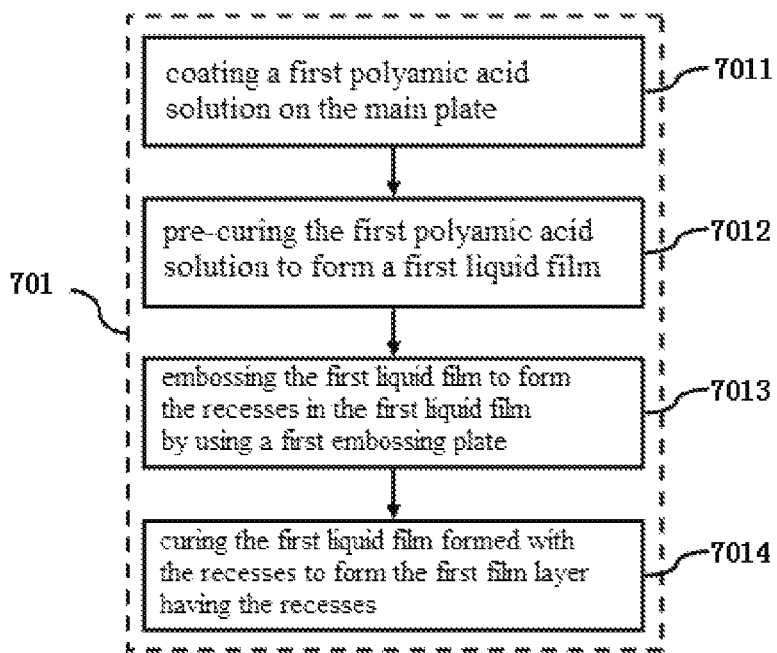
FIG. 8 is a flow chart of a step of disposing a first film layer on the main plate in FIG. 7.
Figure 9:
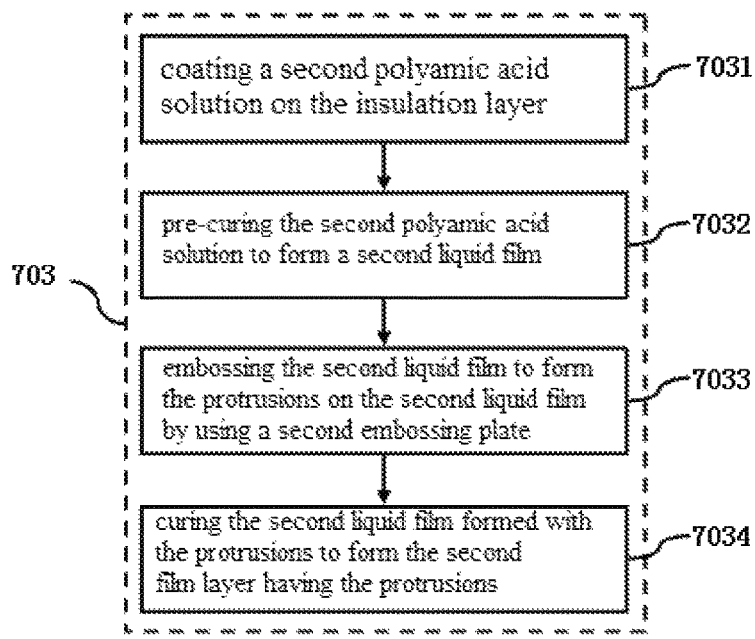
FIG. 9 is a flow chart of a step of disposing a second film layer on the insulation layer in FIG. 7.
Figure 10:
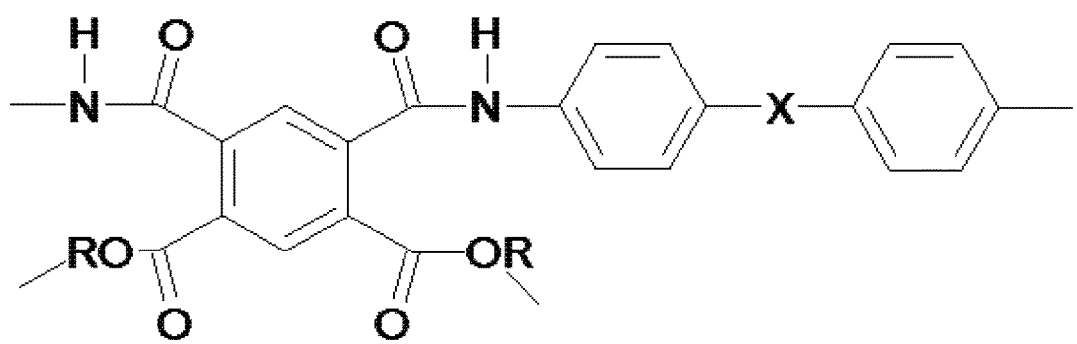
FIG. 10-FIG. 13 are molecular structural views of polyamic acid corresponding to the first film layer and/or the second film layer in the substrate of the present disclosure.
Figure 11:
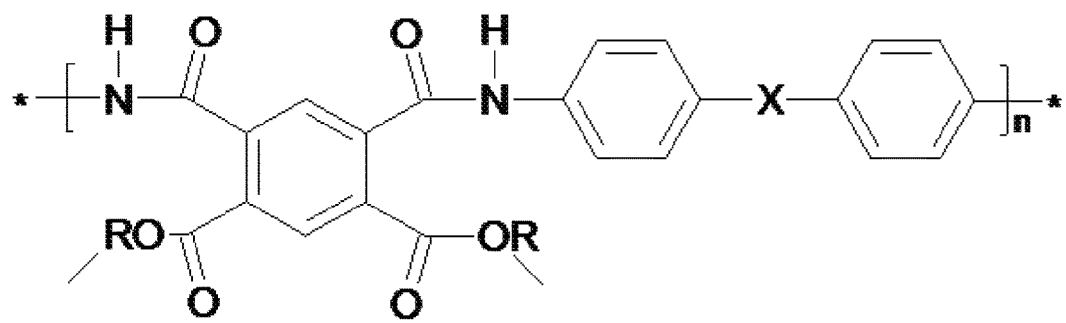
Figure 12:
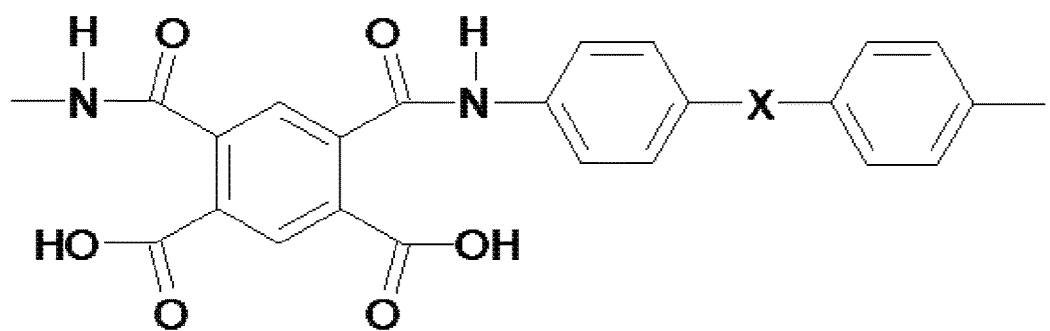
Figure 13:
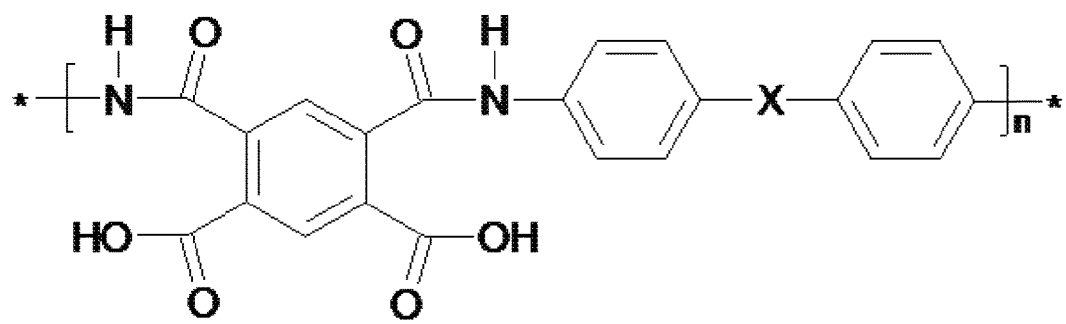

Refer to FIG. 2 to FIG. 9. FIG. 2-FIG. 6 are schematic views of a method for manufacturing a substrate in accordance with the present disclosure. FIG. 7 is a flow chart of a method for manufacturing a substrate 101 in accordance with the present disclosure. FIG. 8 is a flow chart of the step of disposing a first film layer 1012 on the main plate in FIG. 7. FIG. 9 is a flow chart of the step of disposing a second film layer 1014 on the insulation layer in FIG. 7.

A method for manufacturing the substrate 101 of the present disclosure includes steps of:

A. (step 701) disposing the first film layer 1012 on the main plate 1011, wherein the recess array is defined in the side of the first film layer 1012 opposite the main plate 1011, and the recess array includes at least two of the recesses 10121;

B. (step 702) disposing the insulation layer 1013 on the side of the first film layer 1012 in which the recesses 10121 are defined; and C. (step 703) disposing the second film layer 1014 on the insulation layer 1013, wherein the second film layer 1014 provided with the protrusion array, the protrusion array includes at least two protrusions 10141 facing the insulation layer 1013, the shape of the protrusions 10141 corresponds to the shape of the recesses 10121, and the position of the protrusions 10141 on the second film layer 1014 corresponds the position of the recesses 10121 on the first film layer 1012.

In the method for manufacturing the substrate 101 of the invention, the step A includes:

a1. (step 7011) coating a first polyamic acid solution on the main plate 1011;

a2. (step 7012) pre-curing the first polyamic acid solution to form a first liquid film, wherein a concentration of the first liquid film is within a first predetermined range;

a3. (step 7013) embossing the first liquid film to form the recesses 10121 in the first liquid film by using a first embossing plate; and a4. (step 7014) curing the first liquid film formed with the recesses 10121 to form the first film layer 1012 having the recesses 10121.

In the method for manufacturing the substrate 101 of the invention, the step B includes:

depositing a predetermined material on the side of the first film layer 1012 in which the recesses 10121 are defined to form the insulation layer 1013;

wherein the predetermined material includes at least one of amorphous silicon, polysilicon, silicon oxide, aluminum oxide, and titanium oxide.

In the method for manufacturing a substrate 101 of the invention, the step C includes:

c1. (step 7031) coating a second polyamic acid solution on the insulation layer 1013;

c2. (step 7032) pre-curing the second polyamic acid solution to form a second liquid film, wherein a concentration of the second liquid film is within a second predetermined range;

c3. (step 7033) embossing the second liquid film to form the protrusions 10141 on the second liquid film by using a second embossing plate; and c4. (step 7034) curing the second liquid film formed with the protrusions 10141 to form the second film layer 1014 having the protrusions 10141.

The recesses 10121 and the protrusions 10141 are configured to collectively enhance the adhesion the first film layer (polyimide layer) 1012, the second film layer (polyimide layer) 1014 and the insulation layer 1013 for preventing the substrate 101 from being partially peeled off during the bending process.

The recesses 10121 and the protrusions 10141 are configured to collectively prevent an amount of stress from accumulating on the substrate 101, and to collectively reduce an amount of deformation the substrate 101 during a high temperature process.

The first embossing plate and/or the second embossing plate are/is a rigid embossing plate having a first rigidity. The rigid embossing plate is made of a combination of one or more than one of silicon, silicon oxide, and quartz.

The method further includes following steps of:

D. forming the first embossing portions and/or the second embossing portions by a laser writing technique on the plate body of the first platen and/or the plate body of the first platen. The first embossing portions and/or the second embossing portions corresponds to the recesses 10121 and/or the protrusions 10141.

The second embossing portions are formed by a laser writing technique on the plate body of the second embossing plate.

The first embossing plate and/or the second embossing plate are/is a soft embossing plate having a second rigidity. The second rigidity is less than the first rigidity.

The method further includes following steps of:

E. applying a polydimethylsiloxane to the rigid embossing portions;

F. heating the polydimethylsiloxane or irradiating the polydimethylsiloxane with ultraviolet light for curing the polydimethylsiloxane;

G, separating the cured polydimethylsiloxane from the rigid embossing plate for forming the soft embossing plate.

The method further includes the following steps of:

forming the insulation layer 1013 by depositing a predetermined material on the side of the first film layer 1012 in which the recesses 10121 are defined, wherein the predetermined material includes at least one of amorphous silicon, polysilicon, silicon oxide, aluminum oxide, and titanium oxide.

The length and/or the width of the cross section of each of the recesses 10121 is in the range of 10 nm to 1000 nm. For example, the cross section of each of the recesses 10121 has a length and/or a width of 10 nm, 50 nm, 100 nm, 150 nm, 200 nm, 250 nm, 300 nm, 350 nm, 400 nm, 450 nm, 550 nm, 600 nm, 650 nm, 700 nm, 750 nm, 800 nm, 850 nm, 900 nm, 950 nm, or 1000 nm.

The length and/or the width of the cross section of each of the protrusion 10141 is within the range of 10 nanometers to 1000 nanometers. For example, the length and/or the width of the cross section of the protrusion 10141 is 10 nm, 50 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, or 1000 nm.

The shape of the recesses 10121 and/or the protrusions 10141 is a combination of one or more of a dot, a line, a two-dimensional pattern, and a three-dimensional pattern.

As an improvement, a ratio of a thickness difference of any two portions of the insulation layer 1013 to an average thickness of the insulation layer is within a range from 0% to 20%. For example, the ratios can be 0%, 3%, 6%, 9%, 12%, 15%, 18%, or 20%.

In the present disclosure, the substrate includes a main plate 1011, a first film layer 1012, an insulation layer 1013, and a second film layer 1014. The first film layer 1012 is disposed on the main plate body 1011, the insulation layer 1013 is disposed between the first film layer 1012 and the second film layer 1014. The first film layer 1012 is provided with recesses 10121, the second film layer 1014 is provided with protrusions 10141, and the recesses 10121 and the protrusions 10141 face each other and are coupled with each other. Hence, the substrate 101 can effectively reduce the amount of the accumulated stress after being heated, and thereby the substrate 101 is prevented from undergoing a great deformation.

In summary, although the preferred embodiments of the present disclosure are disclosed as above. The aforementioned preferred embodiments are not intended to limit the present disclosure, and one of ordinary skill in the art can make various modifications without departing from the spirit and scope of the invention, Hence, the scope of the present disclosure is defined by the scope of the claims.

What is claimed is:

1. A substrate comprising:
    a main plate;
    a first film layer disposed on the main plate, wherein a recess array is defined in a side of the first film layer opposite the substrate, and the recess array includes at least two recesses, wherein the first film layer includes cured polyamic acid;
    an insulation layer disposed on the side of the first film layer in which the recesses are defined; and
    a second film layer provided with a protrusion array, wherein the protrusion array includes at least two protrusions facing the insulation layer, and the second film layer is disposed on the insulation layer;
    wherein a shape of the protrusions corresponds to a shape of the recesses, and a position of the protrusions on the second film layer corresponds to a position of the recesses in the first film layer.

2. The substrate as claimed in claim 1, wherein the second film layer having the protrusions is formed by coating a second polyamic acid solution on the insulation layer, pre-curing the second polyamic acid solution to form a second liquid film, embossing the second liquid film to form the protrusions on the second liquid film by using a second embossing plate, and curing the second liquid film formed with the protrusions;
    wherein a concentration of the second liquid film is within a second predetermined range.

3. The substrate as claimed in claim 1, wherein the recesses and the protrusions are configured to collectively prevent an amount of stress from accumulating on the substrate, and to collectively reduce an amount of deformation of the substrate during a high temperature process.

4. The substrate according to claim 3, wherein the recesses and the protrusions are configured to collectively enhance an adhesion of the first film layer, the second film layer and the insulation layer.

5. The substrate as claimed in claim 1, wherein a length and/or a width of a cross section of each of the recesses is within a range from 10 nanometers to 1000 nanometers; and a length and/or a width of a cross-section of each of the protrusions is in a range from 10 nanometers to 1000 nanometers.

6. The substrate as claimed claim 1, wherein a ratio of a thickness difference of any two portions of the insulation layer to an average thickness of the insulation layer is within a range from 0% to 20%.

7. A method of manufacturing the substrate as claimed in claim 1, comprising steps of:
   A. disposing the first film layer on the main plate, wherein the recess array is defined in the side of the first film layer opposite the main plate, and the recess array includes at least two of the recesses;
   B. disposing the insulation layer on the side of the first film layer in which the recesses are defined; and
   C. disposing the second film layer on the insulation layer, wherein the second film layer is provided with the protrusion array, the protrusion array includes at least two protrusions facing the insulation layer, the shape of the protrusions corresponds to the shape of the recesses, and the position of the protrusions on the second film layer corresponds to the position of the recesses in the first film layer.

8. The method for manufacturing the substrate as claimed in claim 7, wherein the step A includes:
   a1. coating a first polyamic acid solution on the main plate;
   a2. pre-curing the first polyamic acid solution to form a first liquid film, wherein a concentration of the first liquid film is within a first predetermined range;
   a3. embossing the first liquid film to form the recesses in the first liquid film by using a first embossing plate; and
   a4. curing the first liquid film formed with the recesses to form the first film layer having the recesses.

9. The method for manufacturing the substrate as claimed in claim 7, wherein the step B is:
   depositing a predetermined material on the side of the first film layer in which the recesses are defined to form the insulation layer;
   wherein the predetermined material includes at least one of amorphous silicon, polysilicon, silicon oxide, aluminum oxide, and titanium oxide.

10. The method for manufacturing the substrate as claimed in claim 7, wherein the step C includes:
    c1. coating a second polyamic acid solution on the insulation layer;
    c2. pre-curing the second polyamic acid solution to form a second liquid film, wherein a concentration of the second liquid film is within a second predetermined range;
    c3. embossing the second liquid film to form the protrusions on the second liquid film by using a second embossing plate; and
    c4. curing the second liquid film formed with the protrusions to form the second film layer having the protrusions.

11. The method for manufacturing the substrate as claimed in claim 7, wherein the recesses and the protrusions are configured to collectively prevent an amount of stress from accumulating on the substrate, and to collectively reduce an amount of deformation of the substrate during a high temperature process.

12. The method for manufacturing the substrate as claimed in claim 7, wherein a length and/or a width of a cross section of each of the recesses is within a range from 10 nanometers to 1000 nanometers; and
    a length and/or a width of a cross-section of each of the protrusions is in a range from 10 nanometers to 1000 nanometers.

13. A thin film transistor array substrate, comprising:
    a substrate including:
    a main plate;
    a first film layer disposed on the main plate, wherein a recess array is defined in a side of the first film layer opposite the main plate, and the recess array includes at least two recesses, wherein the first film layer includes cured polyamic acid;
    an insulation layer disposed on the side of the first film layer in which the recesses are defined; and
    a second film layer provided with a protrusion array, wherein the protrusion array includes at least two protrusions facing the insulation layer, and the second film layer is disposed on the insulation layer;
    wherein a shape of the protrusions corresponds to a shape of the recesses, and a position of the protrusions on the second film layer corresponds to a position of the recesses in the first film layer; and
    a display device disposed on the second film layer of the substrate;
    the first film layer includes cured polyamic acid.

14. The substrate as claimed in claim 13, wherein the second film layer having the protrusions is formed by coating a second polyamic acid solution on the insulation layer, pre-curing the second polyamic acid solution to form a second liquid film, embossing the second liquid film to form the protrusions on the second liquid film by using a second embossing plate, and curing the second liquid film formed with the protrusions;
    wherein a concentration of the second liquid film is within a second predetermined range.

15. The substrate as claimed in claim 13, wherein the recesses and the protrusions are configured to collectively prevent an amount of stress from accumulating on the substrate, and to collectively reduce an amount of deformation of the substrate during a high temperature process.

16. The substrate according to claim 15, wherein the recesses and the protrusions are configured to collectively enhance an adhesion of the first film layer, the second film layer and the insulation layer.

17. The substrate as claimed in claim 13, wherein a length and/or a width of a cross section of each of the recesses are/is within a range from 10 nanometers to 1000 nanometers; and
    a length and/or a width of a cross-section of each of the protrusions are/is in a range from 10 nanometers to 1000 nanometers.

18. The substrate as claimed claim 13, wherein a ratio of a thickness difference of any two portions of the insulation layer to an average thickness of the insulation layer is within a range from 0% to 20%.

* * * * *